(12) United States Patent
Kumakura

(10) Patent No.: US 7,341,642 B2
(45) Date of Patent: Mar. 11, 2008

(54) MANUFACTURING METHOD FOR ELECTRIC DEVICE

(75) Inventor: Hiroyuki Kumakura, Kanuma (JP)

(73) Assignees: Sony Corporation, Tokyo (JP); Sony Chemical & Information Device Corporation, Tokyo (JP)

( * ) Notice: Subject to any disclaimer, the term of this patent is extended or adjusted under 35 U.S.C. 154(b) by 33 days.

(21) Appl. No.: 10/647,448

(22) Filed: Aug. 25, 2003

(65) Prior Publication Data

US 2004/0079464 A1  Apr. 29, 2004

Related U.S. Application Data

(63) Continuation of application No. PCT/JP02/01284, filed on Feb. 15, 2002.

(30) Foreign Application Priority Data

Feb. 26, 2001  (JP)  ............... 2001-049615

(51) Int. Cl.
*H01L 21/60*  (2006.01)

(52) U.S. Cl. .................. 156/273.5; 156/312; 156/322; 29/74; 29/832

(58) Field of Classification Search ............ 156/273.5, 156/295, 309.9, 297, 312, 322; 29/832, 740
See application file for complete search history.

(56) References Cited

U.S. PATENT DOCUMENTS 6,077,382 A * 6/2000 Watanabe ................ 156/322
6,365,840 B1 * 4/2002 Honda et al. ............ 174/259
6,458,236 B2 * 10/2002 Takeshita et al. ........ 156/306.9
2002/0173145 A1 * 11/2002 Honda et al. ............ 438/644

FOREIGN PATENT DOCUMENTS

| CN | 1132931 | 10/1996 |
|---|---|---|
| CN | 1191326 | 8/1998 |
| JP | 2-226738 | 9/1990 |
| JP | 4-302444 | 10/1992 |
| JP | 10-56259 | 2/1998 |
| JP | 11-330162 | 11/1999 |
| JP | 2001-024032 | 1/2001 |

OTHER PUBLICATIONS

International Preliminary Examination Report dated Mar. 11, 2003.

(Continued)

*Primary Examiner*—Richard Crispino
*Assistant Examiner*—Barbara J. Musser
(74) *Attorney, Agent, or Firm*—Osha Liang LLP

(57) ABSTRACT

The present invention provides a method of manufacturing an electric device, wherein an adhesive applied on a flexible wiring board is heated to a first temperature to lower its viscosity to a sufficient level, after which a semiconductor chip is placed onto the adhesive at a preset location, so that no air is trapped in the adhesive. The adhesive is heated to a second temperature higher than the first temperature in a permanent bonding step to increase its viscosity, whereby any remaining voids are removed with residual adhesive being pushed aside. Having no voids in the adhesive, the resultant electric device is highly reliable in respect of conductivity.

15 Claims, 8 Drawing Sheets

OTHER PUBLICATIONS

International Search Report, dated May 21, 2002.
English Abstract of Published Publication No. 11-330162 dated Nov. 30, 1999.
English Abstract of Published Pubication No. 2001-024032 dated Jan. 26, 2001.
Notification of Transmittal of and English Translation of PCT International Preliminary Examination Report dated Feb. 24, 2003, 4 pages.
Notification of Reason(s) for Refusal dated Dec. 17, 2004 (2 pages) (Japanese version).
English Translation of Notification of Reason(s) for Refusal dated Dec. 17, 2004 (2 pages).
Patent Abstracts of Japan; Publication No. 02-226738 dated Sep. 10, 1990 (1 page).
Patent Abstracts of Japan; Publication No. 04-302444 dated Oct. 26, 1992 (1 page).
Patent Abstracts of Japan; Publication No. 10-056259 dated Feb. 24, 1998 (1 page).
Chinese Application No. 02808793.3; Office Action dated Oct. 28, 2005 (5 pages).
Chinese Application No. 02808793.3 English Translation of Office Action (4 pages), Oct. 28, 2005.
Chinese Application No. 02808793.3 English translation of Office Action dated Oct. 28, 2005 continuing with claim 1 rejection (4 pages).

* cited by examiner

MANUFACTURING METHOD FOR ELECTRIC DEVICE

CROSS-REFERENCE TO RELATED APPLICATIONS

This application is a continuation of and, pursuant to 35 U.S.C. §120, claims the benefit of PCT/JP02/01284, filed Feb. 15, 2002.

BACKGROUND OF THE INVENTION

1. Field of the Invention

The present invention relates to an adhesive bonding technique used in semiconductor chip mounting.

2. Description of the Related Art

Thermosetting adhesive is commonly used for bonding a semiconductor chip on a substrate such as a flexible wiring board. FIG. 9 shows an electric device 101 composed of a substrate 113 and a semiconductor chip 111 bonded thereon with an adhesive 112.

Metal wiring 122 is arranged on the substrate 113 on a face opposite the chip 111. On the face of the chip 111 opposite the substrate 113, terminals 121 formed as bumps are arranged and abutted on the metal wiring 122 on the opposing substrate 113.

The chip's terminals 121 are connected to its internal circuit not shown in FIG. 9, so the internal circuit is electrically connected to the metal wiring 122 of the substrate 113 through the terminals 121 in the state shown in FIG. 9. The chip 111 and substrate 113 are mechanically connected each other, too, by the adhesive 112 which is cured by application of heat. Bonding of these two elements 111 and 113 is thus achieved by the adhesive 112 without solder.

In a prior art bonding step, the adhesive 112 is first applied or affixed on the surface of the substrate 113 under a normal temperature, after which the semiconductor chip 111 is pressed onto the adhesive 112 using a heated pressing head. One difficulty associated with this prior art technique is that air may be easily trapped during the application or attachment of the adhesive 112 or during the pressing of the chip 111 onto the adhesive 112, resulting in voids (air bubbles) 130 between the substrate 113 and the adhesive 112 or in the adhesive 112 between the terminals 121 of the chip 111. Voids 130 in the adhesive 112 may lead to peeling of the chip 111 or conductivity failure because of the heat applied to the electric device during, e.g., a reflow process.

Air trapping during application of the adhesive 112 can be reduced by lowering the viscosity of the adhesive 112 so as to increase the wettability between the adhesive 112 and the substrate 113 or the chip 111. Once air is trapped, however, it is difficult to remove during heating under pressure.

On the other hand, if the adhesive 112 has a high viscosity, air is more readily trapped but can be removed with ease during heating under pressure; nevertheless connection failure between terminals is likely to occur.

Japanese Patent Laid-Open Publication No. Hei 5-144873 shows a method whereby voids are reduced: A semiconductor chip 111 is pressed against adhesive 112 under a normal temperature using a pressing head, whose temperature is then raised stepwise or continuously to heat the adhesive 112. According to this method, because of the gradual temperature rise of the adhesive 112, it is less likely to generate voids 130. This method, however, has low productivity due to the long tact time (time required for one step of production), because continuous processing of several chips 111 is not possible with a single pressing head which needs to be temperature-controlled.

Another method reduces the tact time by separating the bonding process in two steps and using separate pressing heads; in an alignment step (temporary bonding step), the chips 111 are merely placed at preset locations on the adhesive 112 without applying heat. Only in a permanent bonding step is heat applied with pressure. While productivity is improved with this method, voids 130 are more likely to form. Neither method satisfied the need to produce reliable electric devices 101 in an efficient manner.

SUMMARY OF THE INVENTION

In one aspect, the present invention relates to a method of manufacturing an electric device that is highly reliable because substantially no voids exist in the adhesive.

In one aspect, the present invention provides a method of manufacturing an electric device including a bonding step wherein a semiconductor chip and a substrate are aligned so that a connection terminal on the semiconductor chip and a connection terminal on the substrate face each other, the semiconductor chip is placed onto an adhesive applied on the substrate, and heat is applied while pressing the semiconductor chip so as to connect the opposing connection terminals to each other. In this method, the bonding step includes the steps of: a temporary bonding step of pressing the semiconductor chip onto the adhesive in a state wherein the adhesive is heated to a first temperature; and a permanent bonding step of heating the adhesive to a second temperature higher than the first temperature while applying pressure to the semiconductor chip, wherein when the semiconductor chip is pressed onto the adhesive in the temporary bonding step, pressure is applied to the semiconductor chip to an extent that does not cause the opposing connection terminals to be in contact with each other.

In one aspect of the present invention, the first temperature is equal to, or higher than, a reaction start temperature of the adhesive and below a reaction peak temperature of the adhesive.

In one aspect of the present invention, the second temperature is equal to, or higher than, the reaction peak temperature of the adhesive.

In one aspect of the present invention, the temporary bonding step includes placing the substrate onto a first table, and heating the first table to the first temperature.

In one aspect of the present invention, the temporary bonding step includes pressing the semiconductor chip onto the adhesive after aligning the semiconductor chip and the substrate.

In one aspect of the present invention, the permanent bonding step includes transferring the substrate onto a second table different from the first table.

In one aspect of the present invention, the permanent bonding step includes heating a heatable pressing head to the second temperature and applying pressure to the semiconductor chip with the pressing head.

In one aspect of the present invention, the permanent bonding step includes bringing the opposing connection terminals into contact with each other, and heating the adhesive to the second temperature thereafter.

In one aspect of the present invention, the reaction start temperature of the adhesive is a temperature at which a differential scanning calorimetry (DSC) curve of the adhesive rises above the baseline, and the reaction peak temperature of the adhesive is a temperature at which heat generation is at its peak in the DSC curve.

In one aspect of the present invention, the adhesive is preheated to the first temperature before the semiconductor chip is pressed onto the adhesive in the temporary bonding step, so that the viscosity of the adhesive is lower than when it was applied, whereby the adhesive can readily fill in between the connection terminals on the semiconductor chip pressed onto the adhesive, without trapping air.

In this state, the connection terminals of the semiconductor chip have not yet contacted the connection terminals on the substrate, with some adhesive being left between them. Since the first temperature is higher than the reaction start temperature of the adhesive, the curing reaction of the adhesive progresses as long as the adhesive is maintained at the first temperature. On the other hand, since the first temperature is lower than the reaction peak temperature, the reaction is not accelerated. Accordingly, the reaction rate of the adhesive stays within a range of from 2 to 20%.

While the viscosity of the adhesive in this state is higher than when it was applied, the adhesive still has flowability. Therefore, when pressure is applied to the semiconductor chip in the permanent bonding step, the residual adhesive between the connection terminals on the chip and substrate is pushed aside with any remaining voids, thereby removing any voids therein. The connection terminals of the chip are thus contacted to those of the substrate properly.

Heating the adhesive up to the second temperature with these connection terminals in contact with each other cures the adhesive completely, whereby the semiconductor chip and substrate are electrically, as well as mechanically, connected.

The first table for the temporary bonding step may be heated so as to heat the adhesive to the first temperature. The holding mechanism used for the aligning of the chip needs then not be heated, and a normal pressing head at room temperature can be used as the holding mechanism. Alternatively, the pressing head may have both functions of aligning and heating.

DETAILED DESCRIPTION OF THE PREFERRED EMBODIMENTS

Figure 1A:
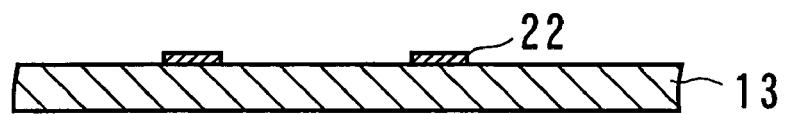
FIG. 1a is a cross section illustrating a process step (1) of a manufacturing method of an electric device according to the present invention.

In each of the accompanying drawings, the following components are commonly denoted by the reference numerals as follows: Reference numerals 1, 2 denote an electric device; 12, 15 denote an adhesive; 11 denotes a semiconductor chip; 13 denotes a substrate or a flexible wiring board; 21 denotes bumps or connection terminals on the semiconductor chip; 22 denotes connection terminals on the substrate; 50 denotes a first table or temporary bonding stage; 70 denotes a second table or permanent bonding stage; and 60 denotes a pressing head or permanent bonding head.

Preferred embodiments of the invention will be hereinafter described with reference to the accompanying drawings.

Thermosetting epoxy resins, latent curing agents in the form of microcapsules, and conductive particles were mixed to prepare adhesives having compositions specified under ACP, ACF, NCP in Table 1. The prepared adhesives are in the form of paste.

Figure 1B:
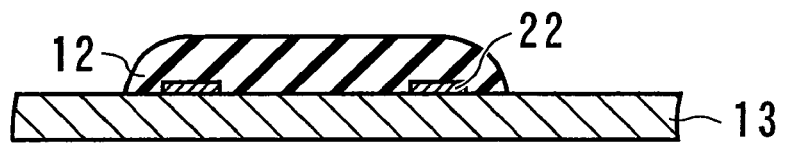
FIG. 1b is a cross section illustrating a process step (2) of the manufacturing method of an electric device according to the present invention.

Referring to FIG. 1a, a plurality of connection terminals 22 are formed on part of the metal wiring on the surface of the flexible wiring board 13 (substrate). The connection terminals 22 are exposed on the flexible wiring board 13 and arranged respectively at locations corresponding to bumps on the semiconductor chip to be described later. When adhesive 12 is applied at a location where the semiconductor chip is to be mounted, the connection terminals 22 on the flexible wiring board 13 are completely covered by the adhesive 12 as shown in FIG. 1b.

Figure 1C:
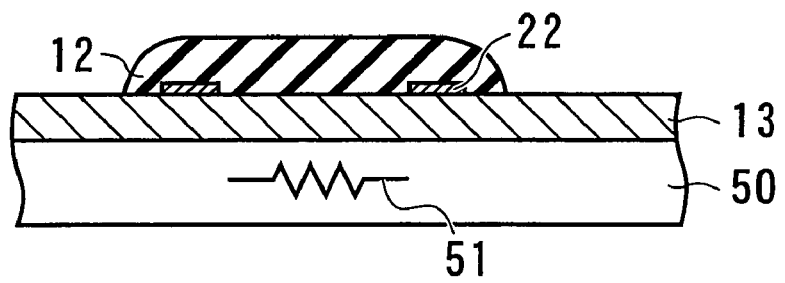
FIG. 1c is a cross section illustrating a process step (3) of the manufacturing method of an electric device according to the present invention.

Reference numeral 51 in FIG. 1c represents a ceramic heater set in the temporary bonding stage 50 (the first table) near the surface. The temporary bonding stage 50 is preheated by the ceramic heater 51 to a temperature equal to, or higher than, the reaction start temperature of the adhesive 12, so that when the flexible wiring board 13 is placed on the temporary bonding stage 50 with the connection terminals 22 upwards, the flexible wiring board 13 and the adhesive 12 are heated to the temperature equal to, or higher than, the reaction start temperature by heat conduction. Power supply to the ceramic heater 51 is then adjusted to heat the adhesive 12 to a temperature within the range of from the reaction start temperature to a reaction peak temperature (first temperature).

Heat applied in this step lowers the viscosity of the adhesive 12, improving its wettability to the flexible wiring board 13, whereby air bubbles (voids) formed by air trapped during the application of adhesive 12 are removed.

Figure 1D:
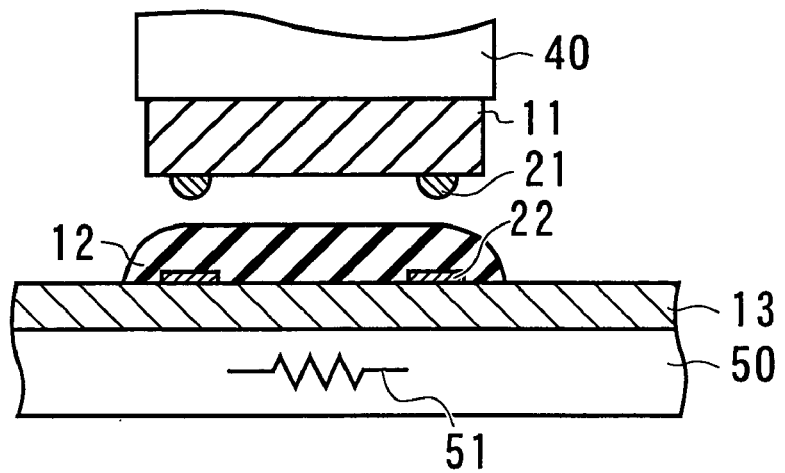
FIG. 1d is a cross section illustrating a process step (4) of the manufacturing method of an electric device according to the present invention.

The semiconductor chip 11 shown in FIG. 1d has a plurality of bumps 21 (connection terminals) on one face thereof, which are electrically connected to an internal circuit (not shown) in the semiconductor chip 11.

Reference numeral 40 in FIG. 1d represents a holding mechanism. As is shown, while the holding mechanism 40 carries the semiconductor chip 11 with the bumps 21 facing downward to a location above the flexible wiring board 13, the semiconductor chip 11 and the flexible wiring board 13 are aligned so that the bumps 21 on the semiconductor chip 11 and the connection terminals 22 on the flexible wiring board 13 face each other. The holding mechanism 40 is then lowered to place the semiconductor chip 11 onto the adhesive 12 on the flexible wiring board 13.

Pressure is applied to the semiconductor chip 11 only to such an extent that the bumps 21 do not make contact with the connection terminals 22 on the flexible wiring board 13. This causes the tips of the bumps 21 to push aside the adhesive 12 into the gaps between adjacent bumps 21. Since the viscosity of the adhesive 12 is made lower than when it was applied by heating, no voids are generated in adhesive 12 when it flows into between the bumps 21.

Figure 2A:
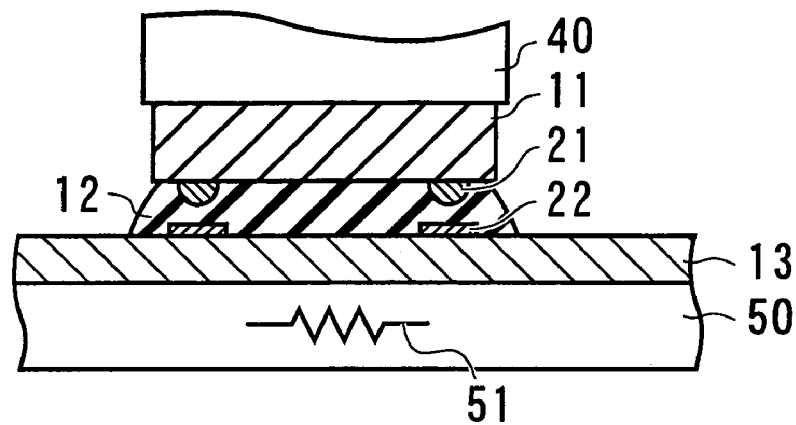
FIG. 2a is a cross section illustrating a process step (5) of the manufacturing method of an electric device according to the present invention.

FIG. 2a shows the state described above; the adhesive 12 has filled between the bumps 21 on the semiconductor chip 11 without any voids. Some adhesive 12 is still left between the opposing bumps 21 and connection terminals 22, so the bumps 21 and connection terminals 22 are not electrically connected yet. Meanwhile, the adhesive 12 is maintained at the aforementioned first temperature by the ceramic heater 51 inside the temporary bonding stage 50.

Due to the heat at the first temperature applied to the adhesive 12, part of microcapsules of latent curing agent starts to melt, slowly accelerating the curing reaction of the adhesive. When the reaction rate of the adhesive 12 has reached a level within a range of 2 to 20%, the holding mechanism 40 is retracted upwards, and the flexible wiring board 13 with the adhesive 12 and semiconductor chip 11 thereon is transferred from the temporary bonding stage 50 onto a permanent bonding stage 70 (second table).

Figure 2B:
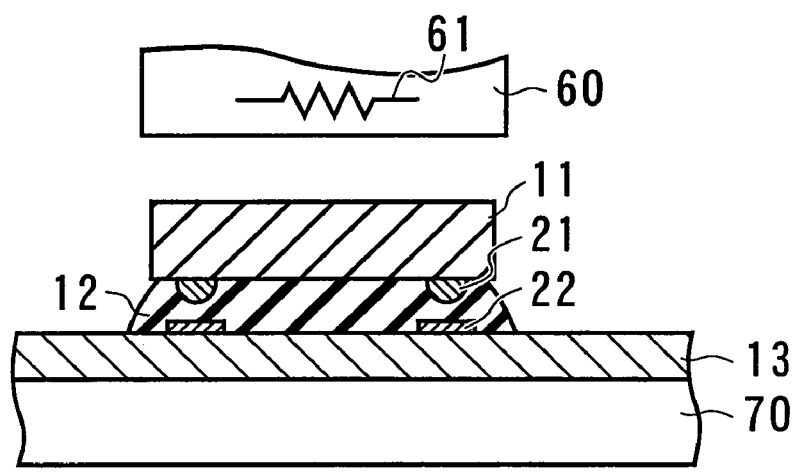
FIG. 2b is a cross section illustrating a process step (6) of the manufacturing method of an electric device according to the present invention.

A permanent bonding head 60(pressing head) is arranged above the permanent bonding stage 70, as shown in FIG. 2b. The permanent bonding head 60 is preheated by a built-in heater 61 to a temperature exceeding at least the reaction peak temperature of the adhesive 12.

The viscosity of the adhesive 12 in the state shown in FIG. 2b is higher than when it was applied, but only to the extent that flowability is not lost.

Thus, the permanent bonding head 60 is pressed onto the semiconductor chip 11 on the adhesive 12 and a predetermined load is applied while being heated, whereby the residual adhesive 12 between the bumps 21 and the connection terminals 22 is pushed aside together with any remaining voids and the bumps 21 come into contact with the connection terminals 22 before the adhesive 12 is heated to a temperature equal to, or higher than, its reaction peak temperature.

When heating under pressure is continued in this state until the adhesive 12 has been heated to a temperature equal to, or higher than, its reaction peak temperature (second temperature), the latent curing agent in the adhesive 12 completely melts, whereby thermal curing reaction of the adhesive progresses rapidly. Thus, the adhesive 12 is completely cured with the bumps 21 making contact with the connection terminals 22.

Figure 2C:
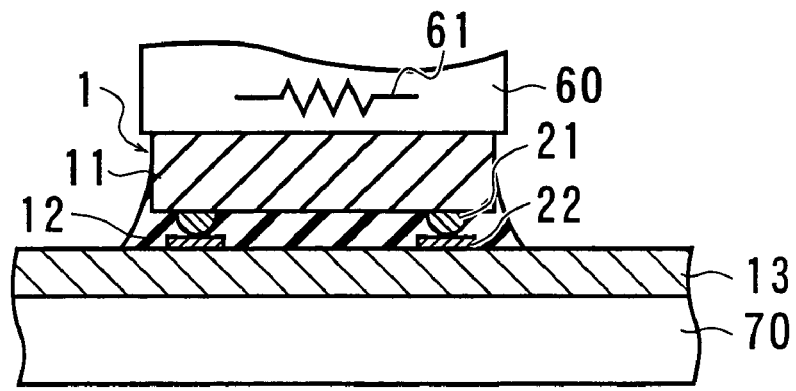
FIG. 2c is a cross section illustrating a process step (7) of the manufacturing method of an electric device according to the present invention.

FIG. 2c illustrates the electric device 1 in which the adhesive 12 is completely cured. The semiconductor chip 11 is connected to the flexible wiring board 13 not only mechanically by the cured adhesive 12, but also electrically through the bumps 21.

While the adhesive 12 in the above embodiment is in the form of a paste, the present invention is not limited thereto and it may take other forms. For instance, the adhesive may be half-cured to exhibit self-supportability, or solid resin may be added to the adhesive, so that it takes the form of a film.

Figure 3A:
FIG. 3a is a cross section illustrating a process step (1) of another manufacturing method of an electric device according to the present invention.
Figure 3B:
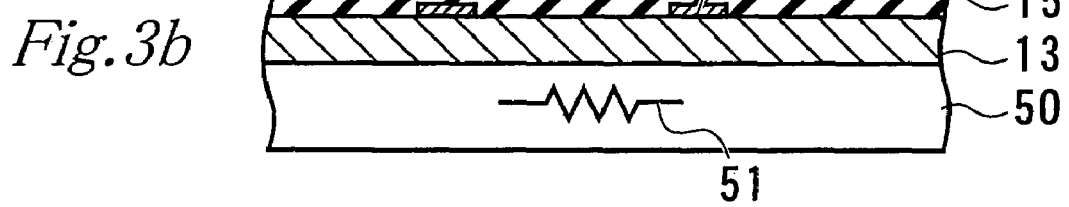
FIG. 3b is a cross section illustrating a process step (2) of another manufacturing method of an electric device according to the present invention.
Figure 3C:
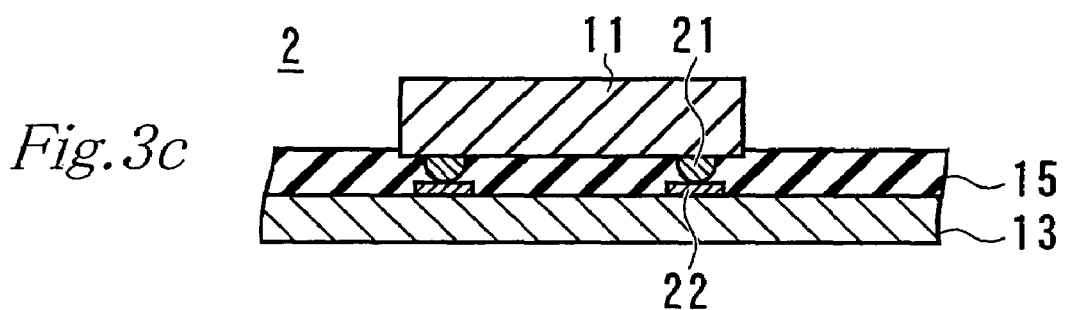
FIG. 3c is a cross section illustrating a process step (3) of another manufacturing method of an electric device according to the present invention.

Reference numeral 15 in FIG. 3a represents one example of such an adhesive film. The adhesive film 15 is affixed on one face of the flexible wiring board 13 where connection terminals 22 are formed as shown in FIG. 3b, and temporary bonding and permanent bonding steps shown in FIG. 1c through 2c are performed. The resultant electric device 2 will appear as shown in FIG. 3c.

EXAMPLES

Epoxy resins, latent curing agents, and conductive particles specified in Table 1 below were mixed in various proportions shown in the table 1 to prepare an adhesive paste containing conductive particles (ACP: anisotropic conductive paste), an adhesive film containing conductive particles (ACF: anisotropic conductive film), and an adhesive paste not containing conductive particles (NCP: non-conductive paste). These amounts are exemplary of suitable compositions, but those having ordinary skill in the art would recognize that other weight proportions may be used.

TABLE 1

Compositions and material proportions of adhesives

| Adhesive | Composition | | Product name | Supplier | Proportion (parts by weight) |
|---|---|---|---|---|---|
| ACP | Latent curing agent | | HX-3722 | Asahi Kasei Epoxy Co., Ltd. | 50 |
| | Thermosetting resin | Bisphenol A-type epoxy | EP828 | Japan Epoxy Resins Co., Ltd. | 20 |
| | | Naphthalene-type epoxy | HP4032D | Dainippon Ink and Chemicals, Inc. | 30 |
| | Conductive particles | | Metal coated resin particles (average particle diameter of 5 μm) | | 15 |
| ACF | Latent curing agent | | HX-3941HP | Asahi Kasei Epoxy Co., Ltd. | 40 |
| | Thermosetting resin | Phenoxy resin | YP50 | Tohto Kasei Co., Ltd. | 25 |
| | | Bisphenol A-type epoxy | EP828 | Japan Epoxy Resins Co., Ltd. | 35 |
| | Conductive particles | | Metal coated resin particles (average particle diameter of 5 μm) | | 15 |

TABLE 1-continued

Compositions and material proportions of adhesives

| Adhesive | Composition | | Product name | Supplier | Proportion (parts by weight) |
|---|---|---|---|---|---|
| NCP | Latent curing agent | | HX-3088 | Asahi Kasel Epoxy Co., Ltd. | 60 |
| | Thermosetting resin | Bisphenol F-type epoxy | EP807 | Japan Epoxy Resins Co., Ltd. | 25 |
| | | | | | 25 |
| | | Naphthalene-type epoxy | HP4032D | Dainippon Ink and Chemicals, Inc. | 15 |

*ACP: adhesive paste containing conductive particles, ACF: adhesive film containing conductive articles, NCP: adhesive paste not containing conductive particles.
*Metal coated resin particles having a resin particle, a Nickel plating film coated on the surface of the resin particles and a gold plating film coated on the surface of the Nickel plating film.

First, DSC analysis was conducted with respect to ACP using a differential scanning calorimeter (sold under the name "DSC200" manufactured by Seiko Instruments Inc.) at a temperature rise rate of 10° C./min, from 30° C. to 250° C. The resultant DSC curve is shown in FIG. 4.

The horizontal axis of the graph represents the temperature (° C.) and the vertical axis shows the heat flow (mW). The letter D indicates the DSC curve, and B indicates the baseline (blank).

Figure 4:
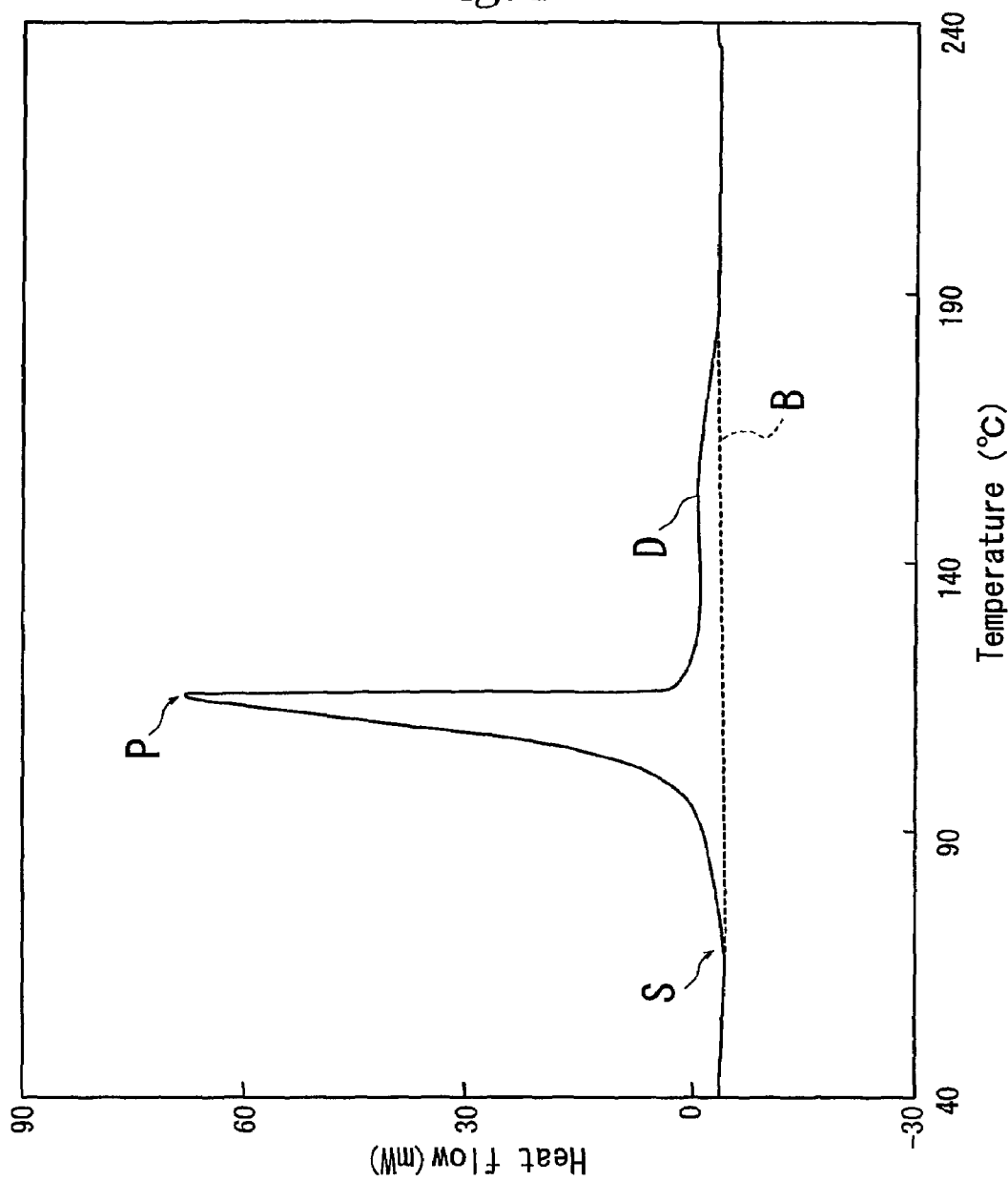
FIG. 4 is a graph showing the DSC curve of the adhesive of first example (ACP)

The letter S in FIG. 4 indicates a point where the DSC curve D rises above the baseline B (reaction start point), which is at 70° C. The letter P indicates a heat generation peak point (reaction peak point) of the DSC curve, which is at 115.2° C. Since the heat generation peak of the DSC curve D is dependent on the thermal curing reaction of ACP, this graph indicates that, upon heating to ACP, the curing reaction of ACP starts at the temperature (reaction start temperature) of 70° C. and reaches the peak at the temperature (reaction peak temperature) of about 115° C. Further, the radical drop in calorific value above the reaction peak temperature indicates that the curing reaction has substantially completed. The calorific value in this state was 442.9 mJ per 1 mg of ACP.

Figure 5:
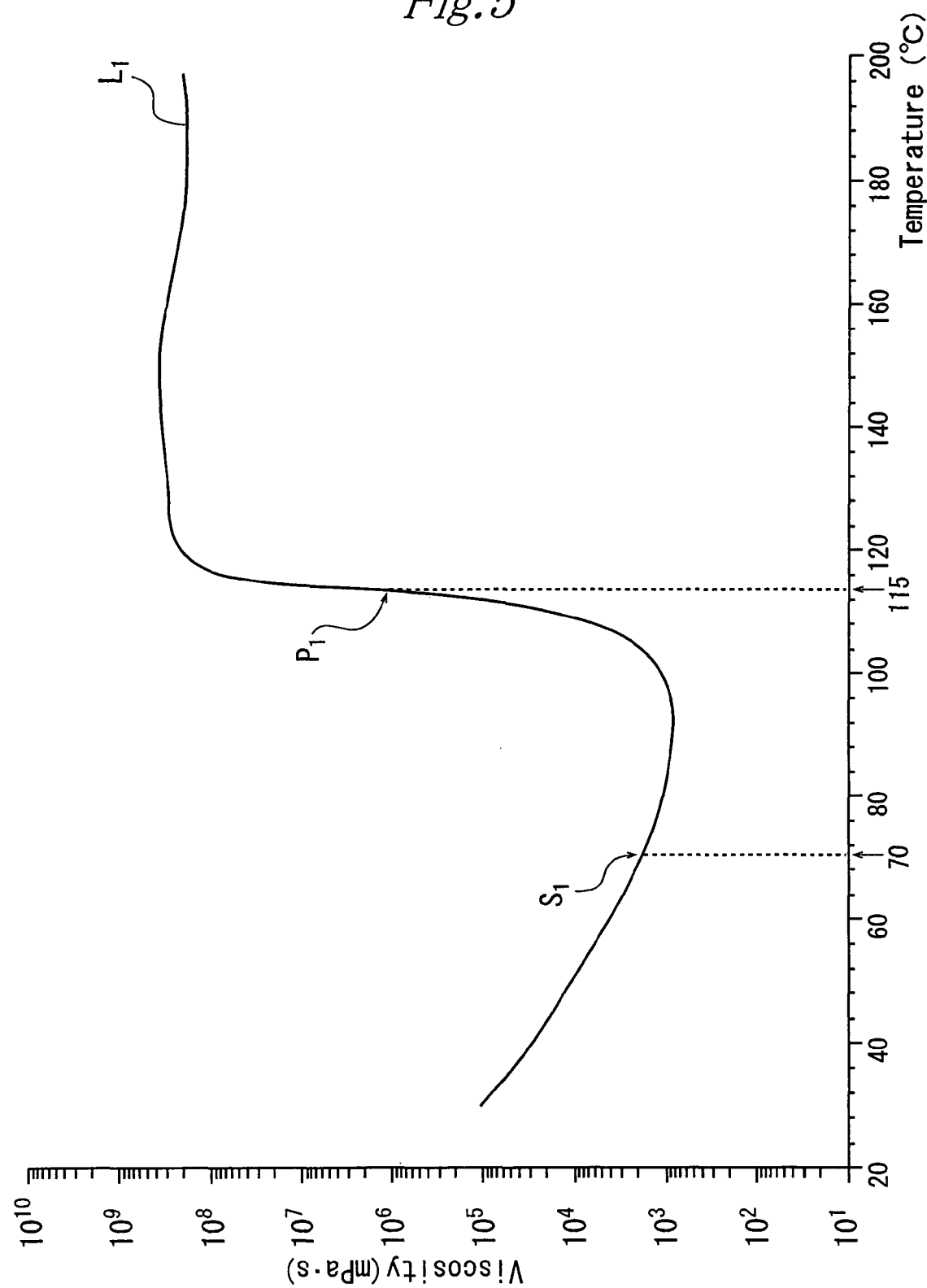
FIG. 5 is a graph showing the temperature-viscosity curve of first example (ACP)

Next, the viscosity change of ACP while being heated from 20° C. to 200° C. at a temperature rise rate of 10° C./min was measured, using a viscometer (HAAKE Rheometer RS75). FIG. 5 is a graph showing the measurement results, its horizontal axis representing the temperature (° C.), and its vertical axis showing the viscosity (mPa·s).

The letters $S_1$ and $P_1$ in FIG. 5 indicate the reaction start temperature and reaction peak temperature corresponding to the points S and P in FIG. 4, respectively. As the temperature-viscosity curve $L_1$ of FIG. 5 shows, the viscosity of heated adhesive is lowest in the range of from the reaction start temperature $S_1$ to the reaction peak temperature $P_1$. The viscosity increases radically above the reaction peak temperature $P_1$ because of the progression of the adhesive curing reaction.

Figure 6:
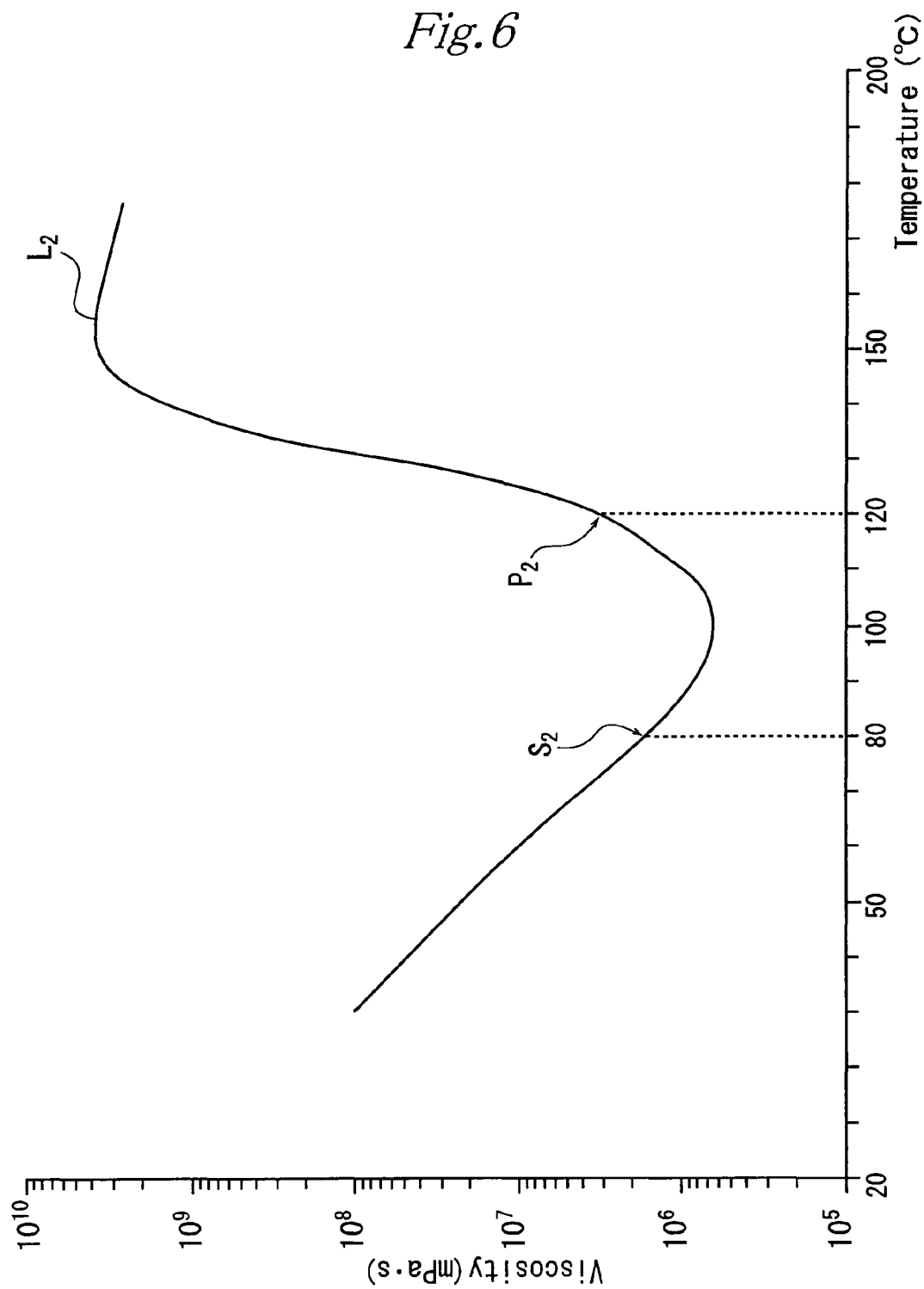
FIG. 6 is a graph showing the temperature-viscosity curve of the adhesive of second example (ACF)
Figure 7:
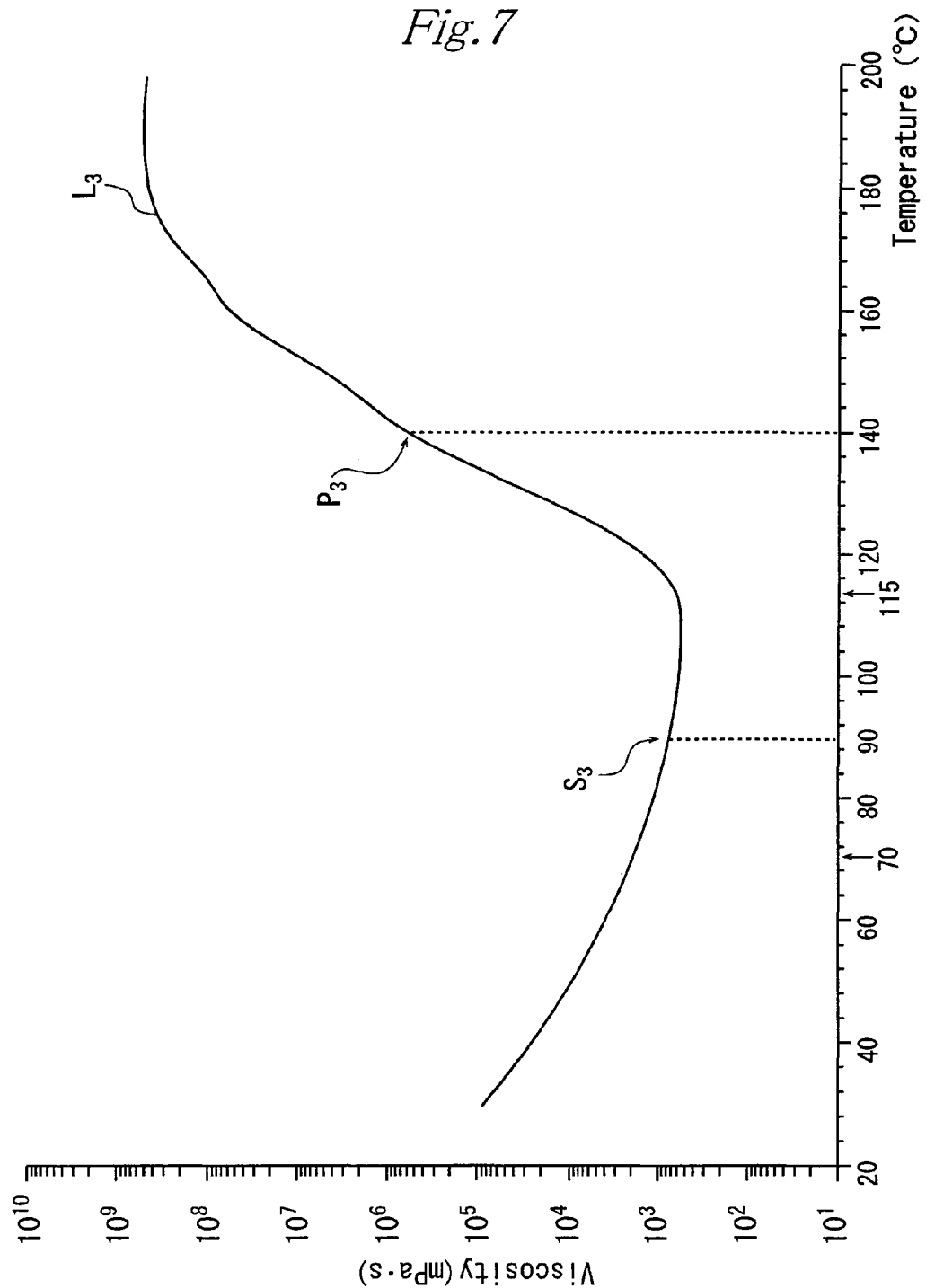
FIG. 7 is a graph showing the temperature-viscosity curve of the adhesive of third example (NCP)

The viscosity changes in the range of from 20° C. to 200° C. of ACF and NCP were also measured. FIG. 6 shows the temperature-viscosity curve $L_2$ of ACF, and FIG. 7 shows the temperature-viscosity curve $L_3$ of NCP. Also, the DSC analysis was conducted with respect to ACF and NCP. The reaction start temperature $S_2$ and reaction peak temperature $P_2$ of ACF obtained from the DSC analysis are shown in FIG. 6, and those $S_3$, $P_3$ of NCP are shown in FIG. 7.

As is clear from the temperature-viscosity curves $L_2$ and $L_3$ in FIG. 6 and FIG. 7, the viscosity was lowest in the range of from the reaction start temperature $S_2$ or $S_3$ to the reaction peak temperature $P_2$ or $P_3$ in both cases where the adhesive was in the form of a film (ACF) and where the adhesive did not contain conductive particles (NCP). These results indicate that, if the adhesive is a thermosetting type, its viscosity is the lowest in a temperature range of from a reaction start temperature to a reaction peak temperature irrespective of adhesive types, and that the curing reaction of the adhesive progresses radically above the reaction peak temperature.

Next, the above three types of adhesives ACP, ACF, and NCP were applied or affixed on a flexible wiring board 13, which was placed on a temporary bonding stage 50. The temporary bonding stage 50 was then heated to raise the temperature of each adhesive 12 to "first temperatures" specified in the following Table 2. The permanent bonding was successively performed in accordance with the steps shown in FIG. 2a to FIG. 2c to obtain electric devices 1 of Examples 1 to 7 and Comparative Examples 1 to 7.

TABLE 2

Reaction start/peak temperatures and various test results of the adhesives

| | Adhesive | | | | | | | |
|---|---|---|---|---|---|---|---|---|
| | Type | Reaction start temperature | Reaction peak temperature | First temperature | Reaction rate (%) | Void apperance | Initial Conductivity | Conductivity after aging |
| Example 1 | ACP | 70° C. | 115° C. | 70° C. | 3.2 | ○ | ○ | ○ |
| Example 2 | | | | 90° C. | 9.7 | ○ | ○ | ○ |
| Example 3 | | | | 110° C. | 17.0 | ○ | ○ | ○ |
| Comparative Example 1 | | | | — | 0 | x | ○ | x |
| Comparative Example 2 | | | | 60° C. | 1.5 | x | ○ | x |

TABLE 2-continued

Reaction start/peak temperatures and various test results of the adhesives

| | Adhesive | | | | | | |
|---|---|---|---|---|---|---|---|
| | Type | Reaction start temperature | Reaction peak temperature | First temperature | Reaction rate (%) | Void appearance | Initial Conductivity | Conductivity after aging |
| Comparative Example 3 | | | | 120° C. | 24.1 | ○ | x | — |
| Example 4 | ACF | 80° C. | 120° C. | 90° C. | 7.4 | ○ | ○ | ○ |
| Example 5 | | | | 110° C. | 14.8 | ○ | ○ | ○ |
| Comparative Example 4 | | | | 70° C. | 1.3 | x | ○ | x |
| Comparative Example 5 | | | | 130° C. | 21.6 | ○ | x | — |
| Example 6 | NCP | 90° C. | 140° C. | 90° C. | 5.2 | ○ | ○ | ○ |
| Example 7 | | | | 120° C. | 16.4 | ○ | ○ | ○ |
| Comparative Example 6 | | | | 80° C. | 1.1 | x | ○ | x |
| Comparative Example 7 | | | | 150° C. | 26.0 | ○ | x | — |

For the flexible wiring board 13, a polyimide film of 20 µm thickness with a 12 µm thick nickel and gold-plated copper wiring was used. The semiconductor chip 11 was a 6 mm square and 0.4 mm thick chip with gold-plated bumps of 60 µm square and 20 µm height. The second temperature to which the adhesive 12 was heated in the permanent bonding step was 230° C., and the load applied in this step was 0.6N per bump.

The electric devices 1 of these Examples 1 to 7 and Comparative Examples 1 to 7 were tested to evaluate the reaction rate, void appearance, initial conductivity, and conductivity after aging, respectively shown below.

(Reaction Rate)

The reaction rate R(%) of each sample of the adhesives 12 after the temporary bonding step in the fabrication process of the electric devices 1 of Examples 1 to 7 and Comparative Examples 1 to 7 was calculated from the equation 1 below by the same method of the DSC analysis described above, using the adhesives before heat application as standard samples:

$$R(\%)=(1-A_2/A_1)\times 100 \quad (1),$$

where $A_1$ is the calorific value per 1 mg of the standard sample by the DSC analysis, and $A_2$ is the calorific value per 1 mg of the sample of the adhesive after the temporary bonding. The reaction rates thus obtained are shown in Table 2 above.

(Void Appearance)

Using a metal microscope, the opposite face of the flexible wiring board 13 from the semiconductor chip 11 of the electric devices 1 of Examples 1 to 7 and Comparative Examples 1 to 7 was observed to ascertain the presence of voids around connection parts where the bumps 21 make contact with the connection terminals 22.

The evaluation results of observations are shown in Table 2 above, "O" indicating that there were no voids larger than the bumps 21, and "X" indicating that there were voids larger than the bumps 21.

(Initial Conductivity)

The conductive resistance across two connection terminals 22 respectively making contact with bumps 21 was measured with respect to each of the electric devices 1 of Examples 1 to 7 and Comparative Examples 1 to 7. The evaluation results are shown in Table 2 above, "O" indicating that the conductive resistance was less than 100 mΩ, and "X" indicating that the conductive resistance was 100 mΩ or more.

(Conductivity After Aging)

After leaving (aging) each of the electric devices 1 of Examples 1 to 7 and Comparative Examples 1 to 7 in a high temperature, high humidity environment of 121° C. and relative humidity of 100% for 100 hours, the conductive resistance was measured with the same method as used in the above evaluation of initial conductivity. The evaluation results are shown in Table 2 above, "O" indicating that the conductive resistance after the aging was less than 500 mΩ, and "X" indicating that the conductive resistance after the aging was 500 mΩ or more.

As is clear from the above Table 2, the electric devices 1 of Examples 1 to 7, in which the adhesive before the temporary bonding was heated to the first temperature in the range of from the reaction start temperature to the reaction peak temperature, showed excellent results in the various tests.

On the other hand, in the electric device of Comparative Example 1, in which no heat was applied before the temporary bonding, or in Comparative Examples 2, 4 and 6, in which the first temperature was lower than the reaction start temperature of each adhesive, voids were present in a large number around the connection parts because the viscosity of the adhesive was not sufficiently lowered before the temporary bonding, as a result of which they showed poor results in the measurement test of conductivity after aging.

In the Comparative Examples 3, 5 and 7 in which the adhesive was heated to a higher temperature than the respective reaction peak temperature before the temporary bonding, while no large voids were observed in the adhesive, the viscosity of the adhesive was too high before the permanent bonding, because of which the adhesive was not pushed aside to a sufficient extent. Thus conductivity between the connection terminals and bumps was poor, resulting in conductivity failure in an initial stage before aging.

While the temporary bonding step and permanent bonding step are carried out on separate stages in the above described embodiment, the present invention is not limited thereto and these may be carried out on the same stage. Further, the step of applying adhesive on the substrate may be performed on the temporary bonding stage.

Also, while the temporary bonding stage 50 is heated to raise the temperature of the adhesive 12 to the first temperature in the above embodiment, the present invention is not limited thereto and can employ various other heating means. The holding mechanism 40 may have a built-in heater, for instance, or the temporary bonding step may be carried out in a heated furnace, to heat the adhesive 12 to the first temperature.

Further, the permanent bonding stage may have built-in heating means to preheat the stage, so as to prevent a temperature drop of the adhesive 12 when the flexible wiring board 13 is transferred from the temporary bonding stage 50 to the permanent bonding stage, whereby the time required for the permanent bonding step can be shortened. In this case, the permanent bonding stage should preferably be heated to a temperature lower than the second temperature, more preferably as low as the first temperature.

While the above embodiment is adapted to connect a semiconductor chip 11 to a flexible wiring board 13, the present invention is not limited thereto and may be applied to fabrication of various other electric devices. A rigid substrate may be used, for example, instead of the flexible wiring board, to fabricate COBs (chip on board).

The invention is also applicable to the connection between TCPs (tape carrier package) and LCDs (liquid crystal display).

Figure 8:
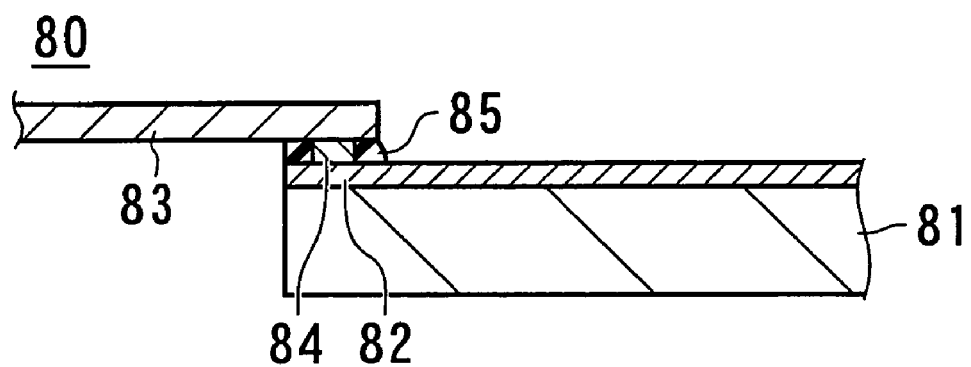
FIG. 8 is a cross section of another example of an electric device according to the present invention.
Figure 9:
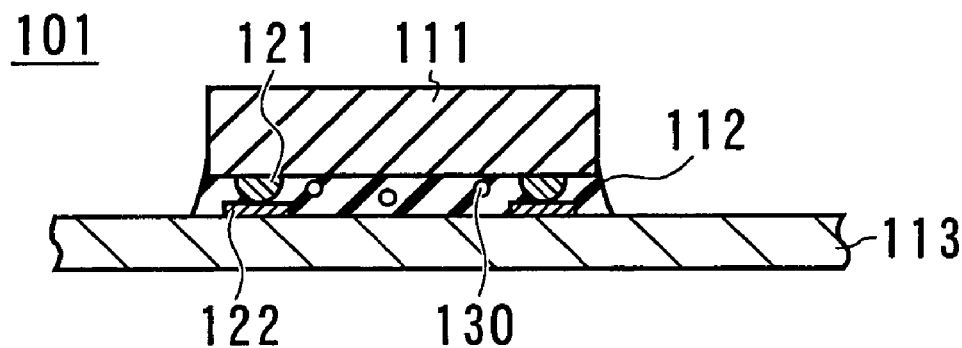
FIG. 9 is a cross section of a prior art electric device.

Reference numeral 80 in FIG. 8 represents an electric device having a TCP 83 and an LCD 81. The TCP 83 includes a connection terminal 84 which is a part of its wiring, and the LCD 81 includes a connection terminal 82 which is a part of its electrode.

The TCP 83 and LCD 81 are connected to each other through the process steps similar to those shown in FIG. 1*a* to FIG. 1*d* and FIG. 2*a* to FIG. 2*c*, and their connection terminals 82, 84 are fixed in contact with each other by the adhesive 85.

Thermosetting resins that may be used in the present invention include epoxy resins, urea resins, melamine resins, phenolic resins and others, among which, epoxy resins are most preferably used in terms of the curing speed and adhesive strength after the curing.

Epoxy resins as thermosetting resins should preferably be used with a curing agent. Examples of curing agents are imidazoles, polyamines, phenols, isocyanates, polymercaptans, anhydrides and others. These curing agents may be microencapsulated and used as latent curing agents.

Further, a thermoplastic resin, such as phenoxy resin, polyester resin and various others, may be added to the adhesive.

The adhesive in the present invention may further contain various other additives such as anti-foaming agents, colorants, antioxidants, fillers, and coupling agents.

According to the present invention, substantially no voids are generated in the adhesive when the semiconductor chip is temporarily bonded on the adhesive on the substrate. Even if some voids are left after the temporary bonding, these are removed as the adhesive is pushed aside in the permanent bonding step, because of the increased viscosity of the adhesive. The resultant electric device thus has no voids in the adhesive and is highly reliable in respect of conductivity.

What is claimed is:

1. A method of manufacturing an electric device including a bonding step wherein a semiconductor chip and a substrate are aligned so that a connection terminal on the semiconductor chip and a connection terminal on the substrate face each other, the semiconductor chip is placed onto an adhesive applied on the substrate, and heat is applied while pressing the semiconductor chip so as to connect the opposing connection terminals to each other, and a temperature of the adhesive showing the lowest viscosity is higher than a reaction start temperature, the bonding step including the steps of:

a preheating step of preheating the adhesive to a first temperature no less than the reaction start temperature of the adhesive and below a reaction peak temperature of the adhesive to reduce the viscosity of the adhesive;

a temporary bonding step applying pressure to press the semiconductor chip onto the adhesive while maintaining the adhesive at the first temperature, wherein the pressing of the semiconductor chip onto the adhesive does not cause the connection terminal on the semiconductor chip to contact the connection terminal on the substrate; and a permanent bonding step of applying pressure to the semiconductor chip in order to make the connection terminal on the semiconductor chip contact the connection terminal on the substrate, and heating the adhesive to a second temperature higher than the first temperature in order to cure the adhesive.

2. The method of manufacturing an electric device according to claim 1, wherein the second temperature is equal to, or higher than, the reaction peak temperature of the adhesive.

3. The method of manufacturing an electric device according to claim 1, wherein the temporary bonding step comprises placing the substrate onto a first table, and heating the first table to the first temperature.

4. The method of manufacturing an electric device according to claim 2, wherein the temporary bonding step comprises placing the substrate onto a first table, and heating the first table to the first temperature.

5. The method of manufacturing an electric device according to claim 1, wherein the temporary bonding step comprises applying pressure to press the semiconductor chip onto the adhesive after aligning the semiconductor chip and the substrate.

6. The method of manufacturing an electric device according to claim 2, wherein the temporary bonding step comprises applying pressure to press the semiconductor chip onto the adhesive after aligning the semiconductor chip and the substrate.

7. The method of manufacturing an electric device according to claim 3, wherein the permanent bonding step comprises transferring the substrate onto a second table different from the first table.

8. The method of manufacturing an electric device according to claim 4, wherein the permanent bonding step comprises transferring the substrate onto a second table different from the first table.

9. The method of manufacturing an electric device according to claim 1, wherein the permanent bonding step comprises heating a heatable pressing head to the second temperature and applying pressure to the semiconductor chip with the pressing head.

10. The method of manufacturing an electric device according to claim 2, wherein the permanent bonding step comprises heating a heatable pressing head to the second temperature and applying pressure to the semiconductor chip with the pressing head.

11. The method of manufacturing an electric device according to claim 1, wherein the permanent bonding step comprises bringing the opposing connection terminals into contact with each other, and heating the adhesive to the second temperature thereafter.

12. The method of manufacturing an electric device according to claim 2, wherein the permanent bonding step comprises bringing the opposing connection terminals into contact with each other, and heating the adhesive to the second temperature thereafter.

13. The method of manufacturing an electric device according to claim 1, wherein the temporary bonding step further comprises maintaining the first temperature of the adhesive and increasing the viscosity of the adhesive.

14. The method of manufacturing an electric device according to claim 1, wherein the temporary bonding step further comprises maintaining the first temperature of the adhesive in order to be 2% to 20% of reaction rate of the adhesive.

15. The method of manufacturing an electric device according to claim 1, wherein the adhesive includes a thermosetting resin and a latent curing agent.

* * * * *